US006309982B1

(12) United States Patent
Chooi et al.

(10) Patent No.: US 6,309,982 B1
(45) Date of Patent: Oct. 30, 2001

(54) METHOD FOR MINIMIZING COPPER DIFFUSION BY DOPING AN INORGANIC DIELECTRIC LAYER WITH A REDUCING AGENT

(75) Inventors: Simon Chooi; Yi Xu, both of Singapore (SG); Yakub Aliyu, Basking Ridge, NJ (US); Mei-Sheng Zhou, Singapore (SG); John Leonard Sudijono, Singapore (SG); Subhash Gupta, Singapore (SG); Sudipto Ranendra Roy, Singapore (SG); Paul Ho, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/803,188

(22) Filed: Mar. 12, 2001

(51) Int. Cl.[7] .......................... H01L 21/31; H01L 21/469

(52) U.S. Cl. .......................... 438/758; 438/784; 438/789

(58) Field of Search .................................... 438/758, 102, 438/784, 623, 789, 790, 661, 643, 687; 257/775, 650, 382, 385, 690

(56) References Cited

U.S. PATENT DOCUMENTS

| | | | | |
|---|---|---|---|---|
| 5,451,542 | * | 9/1995 | Ashby | 437/143 |
| 5,654,232 | * | 8/1997 | Gardner | 438/661 |
| 5,739,590 | * | 4/1998 | Sakanoto et al. | 257/775 |
| 5,985,762 | * | 11/1999 | Geffken | 438/687 |
| 5,998,303 | * | 12/1999 | Sato | 438/758 |
| 6,001,415 | * | 12/1999 | Nogami et al. | 438/643 |
| 6,057,250 | * | 5/2000 | Kirchhoff et al. | 438/784 |

FOREIGN PATENT DOCUMENTS

1011135-A2 * 6/2000 (EP) .

* cited by examiner

*Primary Examiner*—Michael Lebentritt
(74) *Attorney, Agent, or Firm*—George O. Saile; Rosemary L. S. Pike; William J. Stoffel

(57) ABSTRACT

A method for reducing copper diffusion into an inorganic dielectric layer adjacent to a copper structure by doping the inorganic dielectric layer with a reducing agent (e.g. phosphorous, sulfur, or both) during plasma enhanced chemical vapor deposition. The resulting doped inorganic dielectric layer can reduce copper diffusion without a barrier layer reducing fabrication cost and cycle time, as well as reducing RC delay.

19 Claims, 2 Drawing Sheets

30
20
20
11

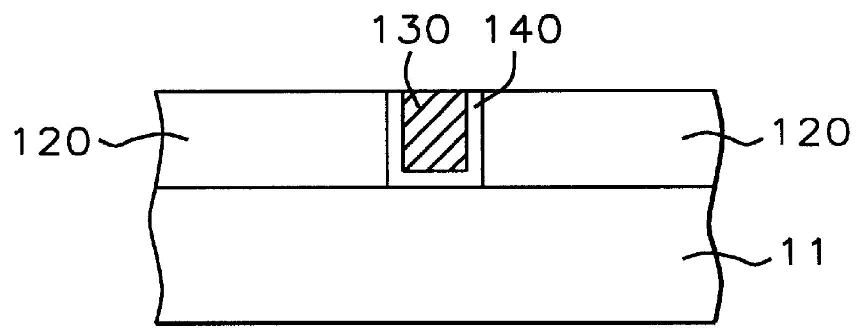
FIG. 1 - Prior Art
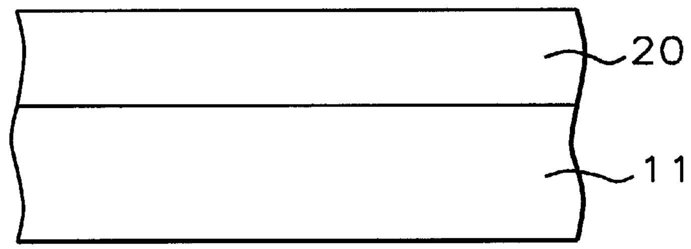
FIG. 2
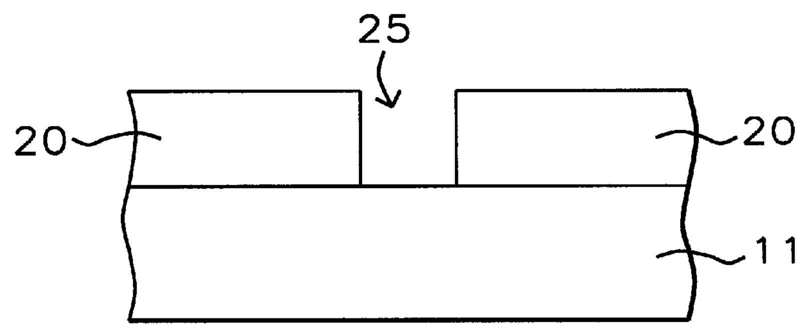
FIG. 3

METHOD FOR MINIMIZING COPPER DIFFUSION BY DOPING AN INORGANIC DIELECTRIC LAYER WITH A REDUCING AGENT

BACKGROUND OF INVENTION

1) Field of the Invention

This invention relates generally to fabrication of a semiconductor device and more particularly to a method for minimizing copper diffusion into a plasma enhance chemical vapor deposition inorganic dielectric layer by doping the inorganic dielectric layer with phosphorous (P), or sulfur (S), or both.

2) Description of the Prior Art

As semiconductor dimensions continue to shrink and performance requirements continue to increase, it has become desirable to use copper for interconnections. However, traditional plasma enhanced chemical vapor deposition (PECVD) oxide ($SiO_2$) dielectric layers suffer from copper migration into the oxide from the interconnect. To prevent this copper migration barrier layers (typically tantalum or tantalum nitride) are deposited onto the sidewalls of contact (via) openings in the dielectric layer, prior to depositing the copper.

As the openings continue to shrink, however, a barrier layer can cause performance problems. The barrier layer can adversely affect RC delay degrading device performance. Coverage of trenches and/or vias by a barrier layer is not uniform. THe barrier layer is thinnest along the side and at the bottom corners of trenches and/or vias, thereby offering poor barrier properties. Also, the crystalline nature of barrier metals tend to allow diffusion of copper along the grain boundaries.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,654,232 (Gardner) shows a method for forming a copper interconnect using a silicon nitride or tantalum wetting layer and a copper reflow process to eliminate voids. Gardner does suggest that the dielectric layer can be phosphorous doped silicon glass (PSG), however the dielectric layer is not in contact with the interconnect. Instead a silicon nitride or tantalum wetting layer is used to prevent copper diffusion. Therefore, Gardner does not suggest eliminating the barrier layer.

U.S. Pat. No. 5,739,590 (Sakamoto et al.) teaches a nitrided sulfur glass (NSG) and phosphorous doped silicon glass (PSG) interlayer insulating film (ILD). This invention does not disclose or suggest copper interconnects, nor does it address copper diffusion.

U.S. Pat. No. 5,451,542 (Ashby) teaches a sulfur surface passivation process.

U.S. Pat. No. 6,001,415 (Nogami et al.) and U.S. Pat. No. 5,985,762 (Geffken et al.) show copper interconnect processes with copper diffusion limited by depositing a barrier layer on the sidewall of an insulating layer prior to depositing copper.

SUMMARY OF THE INVENTION

It is an object of the present invention to provide a method for reducing copper diffusion into an inorganic dielectric layer by doping the inorganic dielectric layer with a doping agent.

It is another object of the present invention to provide a method for forming an inorganic dielectric layer, especially silicon oxide, which is doped with phosphorous or sulfur or both, such that it prevents copper diffusion from adjacent copper structures.

It is another object of the present invention to provide a method for reducing fabrication cost and cycle time for copper contacts by eliminating the need for a barrier layer to prevent copper diffusion.

It is yet another object of the present invention to provide a method for reducing RC delay in copper contacts by eliminating the need for a barrier layer for preventing copper diffusion.

To accomplish the above objectives, the present invention provides a method for doping an inorganic dielectric layer with a reducing agent during plasma enhanced chemical vapor deposition to prevent copper diffusion into the inorganic dielectric layer. The resulting doped inorganic dielectric layer can reduce copper diffusion without a barrier layer reducing fabrication cost and cycle time, as well as reducing RC delay.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 shows a sectional view of a method for preventing copper diffusion into an inorganic dielectric layer according to the prior art.

FIGS. 2 through 4 illustrate sequential sectional views of a method for preventing copper diffusion into an inorganic dielectric layer according to the present invention.

DETAILED DESCRIPTION OF THE INVENTION

Figure 4:
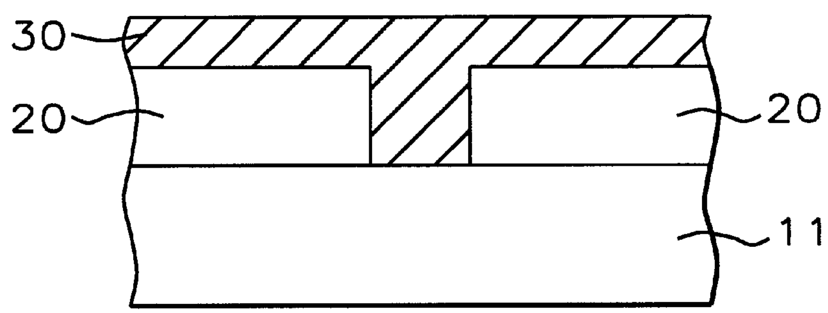

The present invention will be described in detail with reference to the accompanying drawings. The present invention provides a method for reducing copper diffusion into an adjacent inorganic dielectric layer by doping the inorganic dielectric layer with a reducing agent.

Problems With the Prior Art Identified by the Inventors

Referring to FIG. 1, in the prior art copper diffusion from copper structures (130) into an adjacent inorganic dielectric layer (120) is typically prevented by a barrier layer (140). Inorganic dielectric layers, particularly silicon oxide are widely used in semiconductor fabrication to provide electrical isolation between device layers and interconnect layers, as well as between adjacent interconnect layers. Openings (vias) are formed in the inorganic dielectric layers to provide electrical connection between the device layer and an interconnect layer, or between interconnect layers. The openings are filled with a conductive material, typically aluminum, which provides the electrical connection. When copper is used in place of aluminum to reduce resistance, and therefore RC delay, a barrier layer is formed prior to depositing the copper to prevent copper diffusion into the inorganic dielectric layer. However, the inventors have found that, as the openings become smaller, the barrier layer becomes more difficult to economically fabricate. Also, the barrier layer adversely affects performance, increasing RC delay.

Preferred Embodiments of the Present Invention

Referring to FIG. 2, the preferred embodiment of the present invention begins by providing a semiconductor structure (11). Semiconductor structure (11) should be understood to possibly include a wafer or substrate comprising a semiconducting material such as monocrystalline silicon, or any of various other structures known in the art, such as a silicon-on-insulator (SOI) structure. Semiconductor structure (11) should be further understood to possibly include one or more conductive layers and insulating layers and/or one or more active and/or passive devices formed on or over such wafer, substrate, or structure and/or interconnect structures such as metal wirings, vias, plugs, contacts, and trenches.

In the key step of the present invention, as shown in FIG. 2, an inorganic layer (20) which is doped with a reducing agent is formed over the semiconductor structure (11). The inorganic dielectric layer preferably comprises silicon oxide, and the reducing agent is preferably phosphorous, sulfur, or both. The inorganic dielectric layer (20) is formed using a plasma enhanced chemical vapor deposition (PECVD) process with either silane or TEOS reacting with one or more gases containing a reducing agent. Following arc specific examples known to the inventors., These examples are intended to be exemplary and not exclusive of the possible combinations of gasses and parameters within the scope of the present invention.

EXAMPLE 1

In the first example, silane ($SiH_4$) is reacted with nitrous oxide ($N_2O$) and triethyl phosphate ($PO(C_2H_5O)_3$) in a PECVD process with a flow rate ratio of silane to nitrous oxide of between about 1:10 and 1000:1 and a flow rate ratio of silane to triethyl phosphate ($PO(C_2H_5O)_3$) of between about 1:1 and 1000:1. The PECVD process is performed at a pressure of between about 0.1 torr and 500 torr; at a temperature of between about 25° C. and 500° C.; and with a capacitatively coupled RF power of between about 100 watts and 2000 watts. The resulting inorganic dielectric layer (20) comprises a concentration of between about 1 weight-% and 9 weight-% of phosphorous.

EXAMPLE 2

In the second example, silane ($SiH_4$) is reacted with nitrous oxide ($N_2O$) and trimrthyl phosphate ($PO(CH_3O)_3$) in a PECVD process with a flow rate ratio of silane to nitrous oxide of between about 1:10 and 1000:1 and a flow rate ratio of silane to trimethyl phosphate ($PO(CH_3O)_3$) of between about 1:1 and 1000:1. The PECVD process is performed at a pressure of between about 0.1 torr and 500 torr; at a temperature of between about 25° C. and 500° C.; and with a capacitatively coupled RF power of between about 100 watts and 2000 watts. The resulting inorganic dielectric layer (20) comprises a concentration of between about 1 weight-% and 9 weight-% of phosphorous.

EXAMPLE 3

In the third example, tetraethoxysilicate (TEOS) is reacted with oxygen ($O_2$) and triethyl phosphate ($PO(C_2H_5O)_3$) in a PECVD process with a flow rate ratio of TEOS to oxygen of between about 1:1 and 1000:1 and a flow rate ratio of TEOS to triethyl phosphate ($PO(C_2H_5O)_3$) of between about 1:1 and 1000:1. The PECVD process is performed at a pressure of between about 0.1 torr and 500 torr; at a temperature of between about 25° C. and 500° C.: and with a capacitatively coupled RF power of between about 100 watts and 2000 watts. The resulting inorganic dielectric layer (20) comprises a concentration of between about 1 weight-% and 9 weight-% of phosphorous.

EXAMPLE 4

In the fourth example, tetraethoxysilicate (TEOS) is reacted with oxygen ($O_2$) and trimethyl phosphate ($PO(CH_3O)_3$) in a PECVD process with a flow rate ratio of TEOS to oxygen of between about 1:1 and 1000:1 and a flow rate ratio of TEOS to trimethyl phosphate ($PO(CH_3O)_3$) of between about 1:1 and 1000:1. The PECVD process is performed at a pressure of between about 0.1 torr and 500 torr; at a temperature of between about 25° C. and 500° C.; and with a capacitatively coupled RF power of between about 100 watts and 2000 watts. The resulting inorganic dielectric layer (20) comprises a concentration of between about 1 weight-% and 9 weight-% of phosphorous.

EXAMPLE 5

In the fifth example, silane ($SiH_4$) is reacted with nitrous oxide ($N_2O$) and hydrogen sulfide ($H_2S$) in a PECVD process with a flow rate ratio of silane to nitrous oxide of between about 1:10 and 1000:1 and a flow rate ratio of silane to hydrogen sulfide ($H_2S$) of between about 1:10 and 1000:1. The PECVD process is performed at a pressure of between about 0.1 torr and 500 torr; at a temperature of between about 25° C. and 500° C.; and with a capacitatively coupled RF power of between about 100 watts and 2000 watts. The resulting inorganic dielectric layer (20) comprises a concentration of between about 0.01 weight-% and 10 weight-% of sulfur.

EXAMPLE 6

In the sixth example, TEOS is reacted with oxygen ($O_2$) and hydrogen sulfide ($H_2S$) in a PECVD process with a flow rate ratio of TEOS to oxygen of between about 1:1 and 1000:1 and a flow rate ratio of TEOS to hydrogen sulfide ($H_2S$) of between about 1:10 and 1000:1. The PECVD process is performed at a pressure of between about 0.1 torr and 500 torr; at a temperature of between about 25° C. and 500° C.; and with a capacitatively coupled RF power of between about 100 watts and 2000 watts. The resulting inorganic dielectric layer (20) comprises a concentration of between about 0.01 weight-% and 10 weight-% of sulfur

EXAMPLE 7

In the seventh example, silane ($SiH_4$) is reacted with nitrous oxide ($N_2O$), hydrogen sulfide ($H_2S$), and triethyl phosphate ($PO(C_2H_5O)_3$) in a PECVD process with a flow rate ratio of silane to nitrous oxide of between about 1:10 and 1000:1, a flow rate ratio of silane to hydrogen sulfide ($H_2S$) of between about 1:10 and 1000:1, and a flow rate ratio of silane to triethyl phosphate ($PO(C_2H_5O)_3$) of between about 1:1 and 1000:1. The PFCVD process is performed at a pressure of between about 0.1 torr and 500 torr; at a temperature of between about 25° C. and 500° C.; and with a capacitatively coupled RF power of between about 100 watts and 2000 watts. The resulting inorganic dielectric layer (20) comprises a concentration of between about 1 weight-% and 9 weight-% of phosphorous, and a concentration of between about 0.01 weight-% and 10 weight-% of sulfur.

EXAMPLE 8

In the eighth example, TEOS is reacted with oxygen ($O_2$), hydrogen sulfide ($H_2S$), and triethyl phosphate ($PO(C_2H_5O)_3$) in a PECVD process with a flow rate ratio of TEOS to oxygen of between about 1:1 and 1000:1, a flow rate ratio of TEOS to hydrogen sulfide ($H_2S$) of between about 1:10 and 1000:1, and a flow rate ratio of TEOS to triethyl phosphate ($PO(C_2H_5O)_3$) of between about 1:1 and 1000:1. The PECVD process is performed at a pressure of between about 0.1 torr and 500 torr; at a temperature of between about 25° C. and 500° C.; and with a capacitatively coupled RF power of between about 100 watts and 2000 watts. The resulting inorganic dielectric layer (20) comprises a concentration of between about 1 weight-% and 9 weight-% of phosphorous, and a concentration of between about 0.01 weight-% and 10 weight-% of sulfur.

Referring to FIG. 3, the inorganic dielectric layer (20) is patterned to form an opening (25) (via) in the inorganic dielectric layer. The inorganic dielectric layer can be patterned using photolithography as is known in the art (e.g. deposit photoresist, expose through a mask, develop, etch). The opening is preferably etched using a plasma-assisted etching process wherein the gas chemistry comprises one or more gases from the group consisting of: fluorine, fluorocarbons, hydrogen-substituted fluorocarbns, chlorine, chlorocarbons, substituted chlorocarbons, carbon monoxide, helium, oxygen, argon and nitrogen.

Referring to FIG. 4, a copper layer (30) is deposited over the inorganic dielectric layer (20) and in the opening (25). The copper can be sputtered or plated and is most preferably plated over a sputtered seed layer. Optionally, the copper layer (30) can be subjected to rapid thermal annealing at a temperature of between about 50° C. and 450° C. Then the copper layer can be planarized using chemical mechanical polishing, and additional dielectric layer and interconnect layers can be formed as is known in the art.

The key advantages of the present invention are that an inorganic dielectric layer doped with a reducing agent (phosphorous, sulfur, or both) is formed which can reduce copper diffusion into the inorganic dielectric layer without requiring a barrier layer. The present invention can reduce fabrication cost and cycle time, as well as reducing RC delay.

In one embodiment of the present invention, the phosphorous and/or sulfer doped dielectric layers could be used in a dual damascene or triple damascene interconnect. A bottom passivation layer an intermediate etch stop layer, and a top cap layer could be optionally be incorporated between the multiple inorganic dielectric layers of a multiple damascene interconnect. The passivation layer, etch stop layer, and cap layer would comprise the same material (phosphorous and/or sulfer doped oxide) as the inorganic dielectric layers.

While the invention has been particularly shown and described with reference to the preferred embodiments thereof, it will be understood by those skilled in the art that various changes in form and details may be made without departing from the spirit and scope of the invention. For example, phosphorous could be provided by triethyl phosphite ($(C_2H_5O)_3P$) or trimethyl phosphite ($(CH_3O)_3P$), and the sulfur could be provided by ammonium sulfide ($(NH_4)_2S$). Also, ozone could be used in place of oxygen, and inert gases, such as nitrogen and argon, could be used to carry the reactive gases. Additionally, other deposition processes, such as high density plasma chemical deposition (HDPCVD) or sub-atmospheric chemical vapor deposition (SACVD) could be used to deposit the doped inorganic dielectric layer (20).

What is claimed is:

1. A method for reducing copper diffusion into an inorganic dielectric layer by forming the dielectric layer using a plasma enhanced chemical vapor deposition process wherein the inorganic dielectric layer is doped with a reducing agent.

2. The method of claim 1 wherein the plasma enhanced chemical vapor deposition process is silane based and the reducing agent is phosphorous provided by $PO(C_2H_5O)_3$ gas.

3. The method of claim 1 wherein the plasma enhanced chemical vapor deposition process is silane based and the reducing agent is phosphorous provided by $PO(CH_3O)_3$ gas.

4. The method of claim 1 wherein the plasma enhanced chemical vapor deposition process is TEOS based and the reducing agent is phosphorous provided by $PO(C_2H_5O)_3$ gas.

5. The method of claim 1 wherein the plasma enhanced chemical vapor deposition process is TEOS based and the reducing agent is phosphorous provided by $PO(CH_3O)_3$ gas.

6. The method of claim 1 wherein the plasma enhanced chemical vapor deposition process is silane based and the reducing agent is sulfur provided by reacting silane with $N_2O$ and $H_2S$ gasses.

7. The method of claim 1 wherein the plasma enhanced chemical vapor deposition process is TEOS based and the reducing agent is sulfur provided by reacting TEOS with $O_2$ and $H_2S$ gasses.

8. The method of claim 1 wherein the plasma enhanced chemical vapor deposition process is silane based and the reducing agents are phosphorous and sulfur provided by reacting silane with $N_2O$, $H_2S$, and $PO(C_2H_5O)_3$ gasses.

9. The method of claim 1 wherein the plasma enhanced chemical vapor deposition process is TEOS based and the reducing agents are phosphorous and sulfur provided by reacting TEOS with $O_2$, $H_2S$, and $PO(C_2H_5O)_3$ gasses.

10. A method for forming an inorganic dielectric layer with reduced susceptibility to copper diffusion without a barrier layers comprising the steps of:

a) providing a semiconductor structure;

b) forming an inorganic dielectric layer on said semiconductor structure; wherein said inorganic dielectric layer comprises silicon oxide doped with a reducing agent;

c) forming an opening in said inorganic dielectric layer; and d) depositing a copper layer over said inorganic dielectric layer and in said opening.

11. The method of claim 10 wherein said inorganic dielectric layer is doped with phosphorous at a concentration of between about 1 weight-% and 9 weight-% by reacting silane with $N_2O$ and $PO(C_2H_5O)_3$ in a plasma enhanced chemical vapor deposition process with a flow rate ratio of silane to $N_2O$ of between about 1:10 and 1000:1 and a flow rate ratio of silane to $PO(C_2H_5O)_3$ of between about 1:1 and 1000:1; at a pressure of between about 0.1 torr and 500 torr; at a temperature of between about 25° C. and 500° C.; and with an RF power of between about 100 watts and 2000 watts.

12. The method of claim 10 wherein said inorganic dielectric layer is doped with phosphorous at a concentration of between about 1 weight-% and 9 weight-% by reacting silane with $N_2O$ and $PO(CH_3O)_3$ in a plasma enhanced chemical vapor deposition process with a flow rate ratio of silane to $N_2O$ of between about 1:10 and 1000:1 and a flow rate ratio of silane to $PO(CH_3O)_3$ of between about 1:1 and 1000:1; at a pressure of between about 0.1 torr and 500 torr; at a temperature of between about 25° C. and 500° C.; and with an RF power of between about 100 watts and 2000 watts.

13. The method of claim 10 wherein said inorganic dielectric layer is doped with phosphorous at a concentration of between about 1 weight-% and 9 weight-% by reacting TEOS with $O_2$ and $PO(C_2H_5O)_3$ in a plasma enhanced chemical vapor deposition process with a flow rate ratio of TEOS to $O_2$ of between about 1:1 and 1000:1 and a flow rate ratio of TEOS to $PO(C_2H_5O)_3$ of between about 1:1 and 1000:1; at a pressure of between about 0.1 torr and 500 torr; at a temperature of between about 25° C. and 500° C.; and with an RF power of between about 100 watts and 2000 watts.

14. The method of claim 10 wherein said inorganic dielectric layer is doped with phosphorous at a concentration of between about 1 weight-% and 9 weight-% by reacting TEOS with $O_2$ and $PO(CH_3O)_3$ in a plasma enhanced chemical vapor deposition process with a flow rate ratio of TEOS to $O_2$ of between about 1:1 and 1000:1 and a flow rate ratio of TEOS to $PO(CH_3O)_3$ of between about 1:1 and 1000:1; at a pressure of between about 0.1 torr and 500 torr; at a temperature of between about 25° C. and 500° C.; and with an RF power of between about 100 watts and 2000 watts.

15. The method of claim 10 wherein said inorganic dielectric layer is doped with sulfur at a concentration of between about 0.01 weight-% and 10 weight-% by reacting silane with $N_2O$ and $H_2S$ in a plasma enhanced chemical vapor deposition process with a flow rate ratio of silane to $N_2O$ of between about 1:10 and 1000:1 and a flow rate ratio of silane to $H_2S$ of between about 1:10 and 1000:1; at a pressure of between about 0.1 torr and 500 torr; at a temperature of between about 25° C. and 500° C.; and with an RF power of between about 100 watts and 2000 watts.

16. The method of claim 10 wherein said inorganic dielectric layer is doped with sulfer at a concentration of between about 0.01 weight-% and 10 weight-% by reacting TEOS with $O_2$ and $H_2S$ in a plasma enhanced chemical vapor deposition process with a flow rate ratio of TEOS to $O_2$ of between about 1:1 and 1000:1 and a flow rate ratio of TEOS to $H_2S$ of between about 1:10 and 1000:1; at a pressure of between about 0.1 torr and 500 torr; at a temperature of between about 25° C. and 500° C.; and with an RF power of between about 100 watts and 2000 watts.

17. The method of claim 10 wherein said inorganic dielectric layer is doped with phosphorous at a concentration of between about 1 weight-% and 9 weight-% and with sulfur at a concentration of between about 0.01 weight-% and 10 weight-% by reacting silane with $N_2O$, $H_2S$, and $PO(C_2H_5O)_3$ in a plasma enhanced chemical vapor deposition process with a flow rate ratio of silane to $N_2O$ of between about 1:10 and 1000:1, a flow rate ratio of silane to $H_2S$ of between about 1:10 and 1000:1, and a flow rate ratio of silane to $PO(C_2H_5O)_3$ of between about 1:1 and 1000:1; at a pressure of between about 0.1 torr and 500 torr; at a temperature of between about 25° C. and 500° C.; and with an RF power of between about 100 watts and 2000 watts.

18. The method of claim 10 wherein said inorganic dielectric layer is doped with phosphorous at a concentration of between about 1 weight-% and 9 weight-% and with sulfur at a concentration of between about 0.01 weight-% and 10 weight-% by reacting TEOS with $O_2$, $H_2S$, and $PO(C_2H_5O)_3$ in a plasma enhanced chemical vapor deposition process with a flow rate ratio of silane to $O_2$ of between about 1:1 and 1000:1, a flow rate ratio of TEOS to $H_2S$ of between about 1:10 and 1000:1, and a flow rate ratio of TEOS to $PO(C_2H_5O)_3$ of between about 1:1 and 1000:1; at a pressure of between about 0.1 torr and 500 torr; at a temperature of between about 25° C. and 500° C.; and with an RF power of between about 100 watts and 2000 watts.

19. The method of claim 10 wherein said inorganic dielectric layer is used to form a multiple damascene interconnect.

* * * * *